US009521746B2

(12) United States Patent
Zhou et al.

(10) Patent No.: US 9,521,746 B2
(45) Date of Patent: Dec. 13, 2016

(54) CONDUCTIVE FILM AND PREPARATION METHOD THEREOF

(71) Applicant: NANCHANG O-FILM TECH. CO., LTD., Jiangxi (CN)

(72) Inventors: Fei Zhou, Jiangxi (CN); Sheng Zhang, Jiangxi (CN); Yulong Gao, Jiangxi (CN)

(73) Assignee: Nanchang O-Film Tech. Co., Ltd., Jiangxi (CN)

( * ) Notice: Subject to any disclaimer, the term of this patent is extended or adjusted under 35 U.S.C. 154(b) by 476 days.

(21) Appl. No.: 13/968,745

(22) Filed: Aug. 16, 2013

(65) Prior Publication Data

US 2015/0008014 A1 Jan. 8, 2015

Related U.S. Application Data

(63) Continuation of application No. PCT/CN2013/078935, filed on Jul. 5, 2013.

(30) Foreign Application Priority Data

Feb. 5, 2013 (CN) .......................... 2013 1 0045883

(51) Int. Cl.
*H05K 1/02* (2006.01)
*H05K 1/03* (2006.01)
*G06F 3/044* (2006.01)
*H05K 3/10* (2006.01)

(52) U.S. Cl.
CPC ............. *H05K 1/0274* (2013.01); *G06F 3/044* (2013.01); *H05K 1/03* (2013.01); *H05K 3/107* (2013.01)

(58) Field of Classification Search
CPC ................................ H05K 1/2074; H05K 1/03
See application file for complete search history.

(56) References Cited

U.S. PATENT DOCUMENTS

| 2009/0218615 | A1 | 9/2009 | Takeuchi et al. |
| 2011/0017726 | A1* | 1/2011 | Choi et al. ................... 219/552 |
| 2014/0098307 | A1 | 4/2014 | Iwami |

FOREIGN PATENT DOCUMENTS

| CA | 2826027 A1 | 9/2012 |
| CN | 101577148 A | 11/2009 |
| CN | 102063951 A | 5/2011 |
| CN | 102222538 A | 10/2011 |

(Continued)

*Primary Examiner* — Jeremy C Norris
(74) *Attorney, Agent, or Firm* — Rosenberg, Klein & Lee

(57) ABSTRACT

A conductive film includes a transparent insulating substrate and a conductive mesh formed on the transparent insulating substrate, one of them is imprinted to form a meshed-like grooves on a surface thereof, it is simple and quick, having high efficiency; the grooves is printed and filled with metal slurry and sintered to form a conductive mesh, the cost is low; the distance between the lines of the conductive mesh is defined as $d_1$, 100 μm≤$d_1$<600 μm, the square resistance of the conductive mesh is defined as R, 0.1 Ω/sq≤R<200 Ω/sq. In order to reduce the distance between the line, the width of the mesh line is reduced, thereby improving the light transmission of the conductive film; the smaller the square resistance, the better the conductivity of the conductive film, the faster the transmission speed of the signal; the lower metal content ensure the small square resistance, saving raw materials.

17 Claims, 4 Drawing Sheets

(56) References Cited

FOREIGN PATENT DOCUMENTS

| | | | |
|---|---|---|---|
| CN | 203225115 U | 10/2013 |
| EP | 2685463 A1 | 1/2014 |
| JP | 2012-256320 A | 12/2012 |
| JP | 2013-20785 A | 1/2013 |
| WO | 2012/122690 A1 | 9/2012 |

\* cited by examiner

CONDUCTIVE FILM AND PREPARATION METHOD THEREOF

This application is a continuation application of an International Application No. PCT/CN2013/078935, filed on Jul. 5, 2013, entitled "CONDUCTIVE FILM AND PREPARATION METHOD THEREOF", which claims the priority from a Chinese patent application No. 201310045883.3, filed on Feb. 5, 2013, entitled "CONDUCTIVE FILM AND PREPARATION METHOD THEREOF", the disclosures for which are hereby incorporated herein in their entireties by reference.

FIELD OF THE INVENTION

The present invention relates to a field of touch screen, and more particularly relates to a conductive film and a preparation method thereof.

BACKGROUND OF THE INVENTION

The touch screen is regarded as a better way to perform the human-computer interaction, which is more and more widely applied to the field of various electronic devices with a display screen, and the conductive film is an indispensable part in the touch screen.

Currently, the conductive film includes a transparent insulating substrate, a conductive layer and a conductive mesh. The transparent insulating substrate and the conductive layer are adjoined. The conductive mesh is located on the surface of the conductive layer. Exposure and development is a common method of preparing the conductive film. Exposure and exposure is used to transfer silver halide emulsion layer to the conductive layer, and further form the conductive mesh on a surface thereof. By adjusting the silver content of the conductive mesh pattern, the distance between the lines of the mesh, the surface square resistance, and the parameter of conductive particles, the distance between the lines of resulting conductive mesh is 600 μm to 800 μm, the square resistance is 200 Ω/sq to 800 Ω/sq, the metal content of the conductive mesh is 1.3 g/m² to 1.9 g/m². The purpose is to enhance the conductivity of the conductive film.

However, the conductive film has the following technical problems needed to be solved: the too large distance results in the need of using much thicker lines, the optical property is poor; the square resistance is much larger, the transmission rate of signal is reduced, therefore, the touch screen with the conductive film is insensitive, and has a poor user experience.

SUMMARY OF THE INVENTION

In order to solve the problems of poor optical property, large square resistance, slow transmission rate of signal, and insensitive response, a conductive film and a preparation method of the conductive film are provide.

A conductive film includes: a transparent insulating substrate and a conductive mesh formed on the transparent insulating substrate;

a distance between the lines of the conductive mesh is defined as $d_1$, and follows formula 100 μm≤$d_1$<600 μm; a square resistance of the conductive mesh is defined as R, and follows formula 0.1 Ω/sq≤R<200 Ω/sq.

In one embodiment, the conductive film further includes a transparent insulating layer formed on a surface of the transparent insulating substrate, the conductive mesh is embedded or buried in the transparent insulating layer.

In one embodiment, the conductive film further includes a transparent insulating layer laid on a surface of the transparent insulating substrate, the transparent insulating layer forms a plurality of intercrossing grooves, the conductive mesh is received in the grooves.

In one embodiment, the conductive mesh is made of one material selected from the group consisting of gold, silver, copper, aluminum, zinc, and gold silver or an alloy composed of at least two thereof.

In one embodiment, the conductive mesh is made of silver, and a silver content is 0.7 g/m² to 1.8 g/m².

In one embodiment, the distance between the lines of the conductive mesh is defined as $d_1$, and follows formula 200 μm≤$d_1$<500 μm.

In one embodiment, the distance defined as $d_1$ follows formula 200 μm≤$d_1$<350 μm.

In one embodiment, the distance defined as $d_1$ follows formula 350 μm≤$d_1$<500 μm.

In one embodiment, the square resistance of the conductive mesh is defined as R, and follows formula 0.1 Ω/sq≤R<60 Ω/sq.

In one embodiment, a width of the line of the mesh of the conductive mesh is defined as $d_2$, and follows formula 1 μm≤$d_2$≤10 μm.

In one embodiment, the width of the line of the mesh of the conductive mesh is defined as $d_2$, and follows formula 2 μm≤$d_2$≤5 μm.

In one embodiment, the conductive mesh consists of regular graphics in uniform arrangement.

In one embodiment, the transparent insulating layer is made of one material selected from the group consisting of light curing adhesive, thermosetting adhesive, and self-curing adhesive.

In one embodiment, the transparent insulating layer is made of one material selected from the group consisting of shadowless adhesive, optical clear adhesive and liquid optical clear adhesive.

In one embodiment, a thickness of the transparent insulating layer is defined as $d_4$, and a width of the grooves is defined as $d_3$, and follows formula 0.5≤$d_4/d_3$≤1.5.

In one embodiment, the transparent insulating layer is provided with a protective layer on the side thereof defining the grooves for improving the effect of mechanical properties of the transparent insulating layer and preventing the transparent insulating layer from being scratched.

In one embodiment, the transparent insulating substrate is made of material selected from the group consisting of polyethylene terephthalate plastic, transparent plastic material, polycarbonate, and glass.

A method of preparing of a conductive film includes the following steps:

imprinting the transparent insulating substrate or a transparent insulating layer by a mold to define a plurality of meshed-like grooves in a surface of the transparent insulating substrate or a transparent insulating layer, the transparent insulating substrate and the transparent insulating layer adjoining, and the distance between the lines formed on the mold being defined as $d_1$, and following formula 100 μm≤$d_1$<600 μm;

curing the grooves;

filling through blade coating, wherein the metal slurry is filled into the grooves through blade coating; and sintering and curing the filled metal slurry to form a conductive mesh, with the square resistance of the conductive mesh being defined as R, and following formula 0.1 Ω/sq≤R<200 Ω/sq, and a metal content being 0.7 g/m² to 0.8 g/m², thus the conductive film being formed.

In one embodiment, the imprinting by the mold includes the following steps:

imprinting the grooves, wherein the transparent insulating substrate is imprinted to form the meshed-like grooves on a surface thereof; and forming the transparent insulating layer, wherein a glue is coated inside the grooves to form the transparent insulating layer;

or following steps forming the transparent insulating layer, wherein a glue is coated on the surface of transparent insulating substrate to form the transparent insulating layer; and imprinting the grooves, wherein the transparent insulating layer is imprinted to form the meshed-like grooves on a surface thereof.

In the conductive film, the transparent insulating substrate is imprinted to form a meshed-like grooves on a surface thereof, it is simple and quick, and the efficiency is high; the grooves are filled with metal slurry, and then the metal slurry is sintered to form a conductive mesh, the cost is low; a distance between the lines of the conductive mesh is defined as $d_1$, and follows formula 100 µm≤$d_1$<600 µm, a square resistance of the conductive mesh is defined as R, and follows formula 0.1 Ω/sq≤R<200 Ω/sq; the square resistance of the conductive mesh is defined as R, and follows formula 0.1 Ω/sq≤R<200 Ω/sq, when the metal content is in a certain content, the distance between the lines is defined as $d_1$, and follows formula 100 µm≤$d_1$<600 µm. In order to reduce the distance between the lines, the width of the mesh line must be reduced, thereby improving the light transmission property of the conductive film; the smaller the square resistance, the better the conductivity of the conductive film, the faster the transmission speed of signal; and the deviation of the square resistance is reduced.

DETAILED DESCRIPTION OF THE EMBODIMENTS

Illustrative embodiments of the invention are described below. The following explanation provides specific details for a thorough understanding of and enabling description for these embodiments. One skilled in the art will understand that the invention can be practiced without such details. In other instances, well-known structures and functions have not been shown or described in detail to avoid unnecessarily obscuring the description of the embodiments.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

The word transparent" used in the transparent insulating substrate in the present invention can be understood as "transparent" and "substantially transparent"; The word "insulating" used in the transparent insulating substrate in the present invention can be understood as the "insulating" and "dielectric", therefore "the transparent insulating substrate" in the present invention includes but is not limited to a transparent insulating substrate, a substantially transparent insulating substrate, a transparent dielectric substrate and a substantially dielectric substrate transparent.

Figure 1:
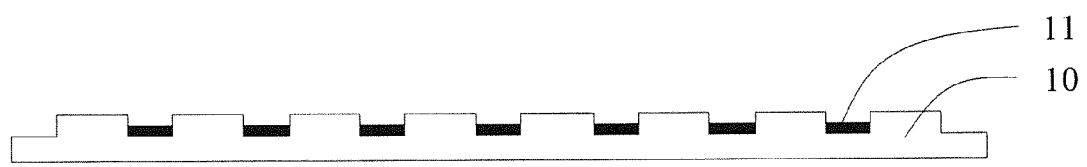
FIG. 1 is a schematic, cross-sectional view of a conductive film of the present invention.

Referring to FIG. 1, a conductive film includes a transparent insulating substrate 10 and a conductive mesh 11 formed on the transparent insulating substrate 11. The transparent insulating substrate 10 is transparent and insulating, has great optical performance, and thereby not impacting the light transmission of the conductive film. The conductivity of the conductive mesh 11 ensures the conductivity of the conductive film. The conductive film can be applied to the touch screen due to the light transmission and the conductivity.

Figure 2:
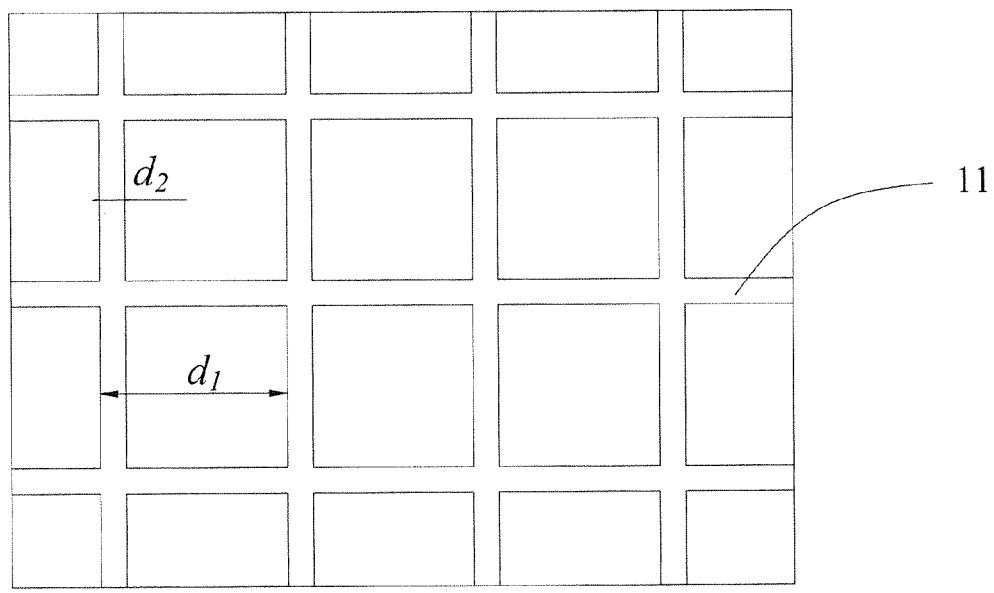
FIG. 2 is a schematic, plane view of a linear conductive mesh of the conductive film of the present invention.
Figure 3:
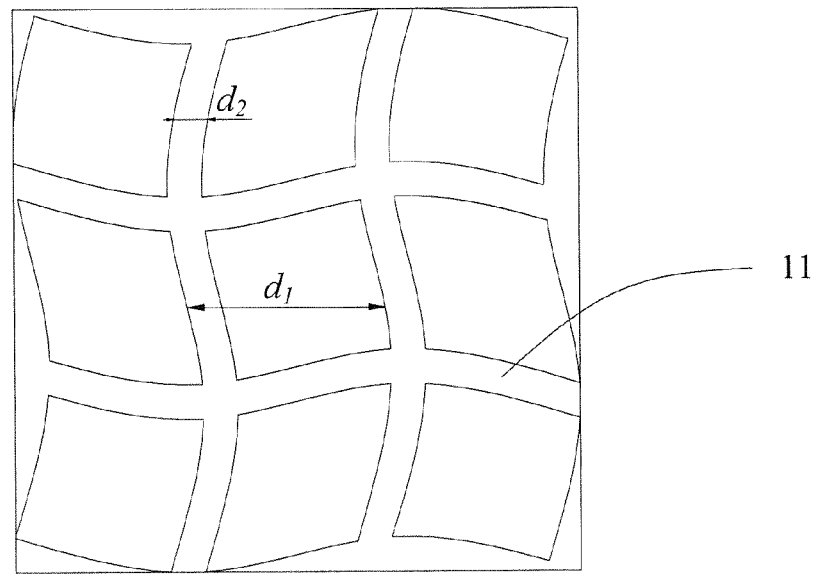
FIG. 3 is a schematic, plane view of a wavy line conductive mesh of the conductive film of the present invention.

Referring to FIG. 2 and FIG. 3, a distance between the lines of the conductive mesh 11 is defined as $d_1$, and follows formula 100 µm≤$d_1$<600 µm. A square resistance of the conductive mesh 11 is defined as R, and follows formula 0.1 Ω/sq≤R<200 Ω/sq. The distance $d_1$ between the lines of the conductive mesh 11 is reduced, i.e. follows formula 100 µm≤$d_1$<600 µm. Therefore, reducing the width $d_2$ of the line of the formed mesh to get a finer line of the mesh is needed. Since the conductive mesh 11 is opaque, the reducing of the width $d_2$ of the line of the mesh can increase the area of light transmission, the light transmission of the conductive film can be improved. The square resistance of the conductive film decides its conductivity. i.e. reducing the square resistance of the conductive film can improve the conductivity of the conductive film, the smaller the square resistance, the better the conductivity and the faster the transmission speed of the signal. The square resistance R of the conductive mesh 11 is reduced till 0.1 Ω/sq≤R<200 Ω/sq, the conductivity of the conductive film is improved, and the transmission speed of the signal is fast.

In the illustrated embodiment, the transparent insulating substrate 10 of the conductive film is made of any one highly transparent material selected from the group consisting of polyethylene terephthalate plastic, transparent plastic, polycarbonate, and glass.

In the illustrated embodiment, the conductive film further includes a transparent insulating layer 12 formed on a surface of the transparent insulating substrate 10. The conductive mesh 11 is embedded or buried in the transparent insulating layer 12. The transparent insulating layer 12 is formed by the curing of one material selected from the group consisting of light curing adhesive, thermosetting adhesive and self-curing adhesive, preferably UV-curing adhesive, optical adhesive or liquid optical adhesive (LOCA). The light curing adhesive, thermosetting adhesive and self-curing adhesive have properties of quick curing, low curing conditions and high strength, therefore, curing of these kinds of adhesives can be achieved without complex processing and high cost. The optical adhesive can be OCA optical sheet, UV-curing adhesive, OCA optical sheet or liquid optical adhesive, is capable of being well bonded to the sodium silicate, metal, plastic and the likes, with high bonding strength, good transparency, and without stress cracking after curing. The efficiency is greatly improved due to the quick curing property. For convenience, spreading the adhesive material on the substrate 10 can be carried on through automatic dispensing or screen printing sizing.

Figure 4:
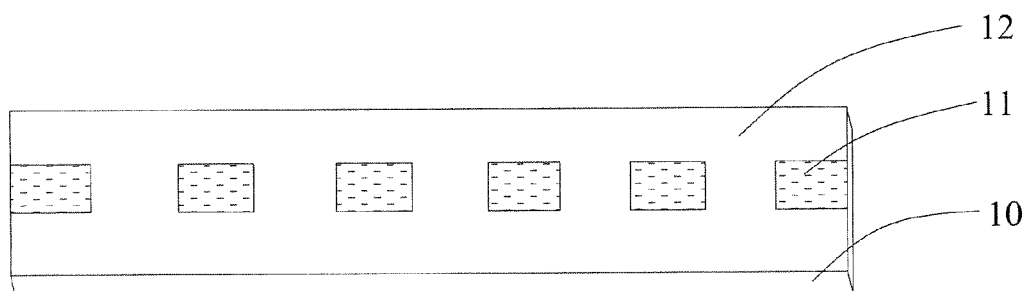
FIG. 4 is a perspective view of a conductive mesh buried in the transparent insulating layer of the present invention.

The transparent insulating substrate 10 defines a groove structure by photolithography or imprinting. A glue is coated on the surface of the grooves structure, then cured to formed the transparent insulating layer 12. The groove structure of the transparent insulating layer 12 is filled with conductive slurry to form the conductive mesh 11, which is thereby embodied in the transparent insulating layer 12. Alternatively, referring to FIG. 4, the transparent insulating substrate 10 defines a groove structure, and the groove structure is filled with silver slurry by blade coating, and then sintered and cured to form the conductive mesh 11. A glue is coated on the surfaces of the transparent insulating substrate 10 and the conductive mesh 11, then sintered and cured to form the transparent insulating layer 12, therefore the conductive mesh 11 is buried in the transparent insulating layer 12.

In one embodiment, the conductive film further includes a transparent insulating layer 12 formed on a surface of the transparent insulating substrate 10, and defining a plurality of intercrossing grooves in which the conductive mesh is embedded. The transparent insulating layer 12 has a high bonding strength which enables the transparent insulating layer 12 to be well bonded to the sodium silicate, metal, plastic and the like. After being bonded to the transparent insulating substrate 10, the plurality of intercrossing grooves are formed in a surface of the transparent insulating layer 12 via various methods, such as mold imprinting. Then, the conductive mesh 11 is embedded in the grooves of the transparent insulating layer 12. The process aforementioned is simple to operate, efficiency and low cost.

Figure 5:
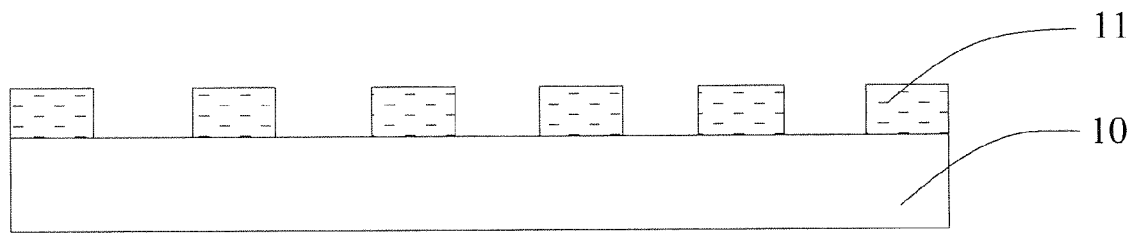
FIG. 5 is a schematic, cross-sectional view of a conductive mesh arranged on the transparent insulating substrate directly of the present invention.

Alternatively, as shown in FIG. 5, the conductive mesh 11 can be formed on the surface of the transparent insulating substrate 10 without grooves.

The conductive mesh 11 is made of one material selected from the group consisting of gold, silver, copper, aluminum, zinc, gold silver or an alloy composed of at least two thereof. The material is easily available, and cheap, especially nano-silver, which has a low cost and a better conductivity.

In the illustrated embodiment, the conductive mesh 11 is made of silver, and the silver content is 0.7 g/m$^2$ to 1.8 g/m$^2$, which is low. On the premise of guarantee of good light transmittance and conductivity of the conductive film, the silver content should be as lower as possible to save material and reduce the cost.

The distance $d_1$ between the lines of the conductive mesh 11 is preferably 200 μm≤$d_1$<500 μm. When the size of the touch screen is below 14 inch, preferably, the distance $d_1$ between the lines of the conductive mesh is 200 μm≤$d_1$<350 μm, when the size of the touch screen is more than 14 inch, the distance $d_1$ between the lines of the conductive mesh is 350 μm≤$d_1$<500 μm. The distance $d_1$ is associated with the size of the touch screen, and should be mainly evaluated from the light transmission, the conductivity and cost of the conductive film. On the premise of satisfying the corresponding requirement for light transmission and the conductivity, the cost should be reduced as low as possible.

The square resistance of the conductive mesh 11 is defined as R, which is preferably 0.1 Ω/sq≤R<200 Ω/sq. When the square resistance R is within this range, the conductivity of the conductive film and the transmission speed of the signal are significantly increased. Furthermore, processing accuracy is lower compared to 0.1 Ω/sq≤R<200 Ω/sq, thus the technical requirements and the cost of the process are reduced on the premise of guarantee of high conductivity.

The width of the line of the mesh of the conductive mesh 11 is defined as $d_2$, and follows formula 1 μm≤$d_2$≤10 μm. The width of the line of the mesh has an impact to the light transmission of the conductive film, the smaller the width of the line of the mesh, the better the light transmission. When the distance between the lines $d_1$ should be 100 μm≤$d_1$<600 μm, and the square resistance of the conductive mesh 11 should be 0.1 Ω/sq≤R<200 Ω/sq, the width of the line d2 can be 1 μm≤$d_2$≤10 μm, which make the light transmission of the conductive film been improved. In particular, when the width of the line of the mesh of the conductive mesh 11 is 2 μm≤$d_2$<5 μm, larger area of the light transmission of the conductive film, and thereby better light transmission are obtained, at the same time, and the requirement of process accuracy is relatively lower.

In the embodiment one, $d_1$=200 μm, R=4 Ω/sq to 5 Ω/sq, the silver content is 1.1 g/m$^2$, the width d of the line is 500 nm to 5 μm. Of course, the square resistance R and the silver content are related to the width $d_2$ of the line and the depth of the grooves for filling. The larger the width $d_2$ of the line and the depth of the grooves for filling, the higher the square resistance and the silver content.

In the embodiment two, $d_1$=300 μm, R=10 Ω/sq, the silver content is 0.9 g/m$^2$ to 1.0 g/m$^2$, the width $d_2$ of the line is 500 nm to 5 μm. Apparently, the square resistance R and the silver content are related to the width $d_2$ of the line and the depth of the grooves for filling. The larger the width $d_2$ of the line and the depth of the grooves for filling, the higher the square resistance and the silver content.

In the example three, $d_1$=500 μm, R=30 Ω/sq to 40 Ω/sq, the silver content is 0.7 g/m$^2$, the width of the line $d_2$ is 500 nm to 5 μm. Apparently, the square resistance R and the silver content are related to the width $d_2$ of the line and the depth of the grooves for filling. The larger the width $d_2$ of the line and the depth of the grooves for filling, the higher the square resistance and the silver content.

The conductive mesh 11 consists of regular graphic in uniform arrangement. Since the conductive mesh 11 is uniformly arranged, and has equal distance $d_1$ between the every neighboring lines, the conductive film has an evenly transmittance. On the other hand, the conductive mesh 11 has even surface resistance and small resistance deviation, therefore, compensation for resistance deviation is unnecessary, and thus enable the imaging to be in uniform. The graphic of the conductive mesh 11 can be linear plaids consisted of substantially orthogonal line or plaids consisted of curved wavy lines, etc.

Figure 6:
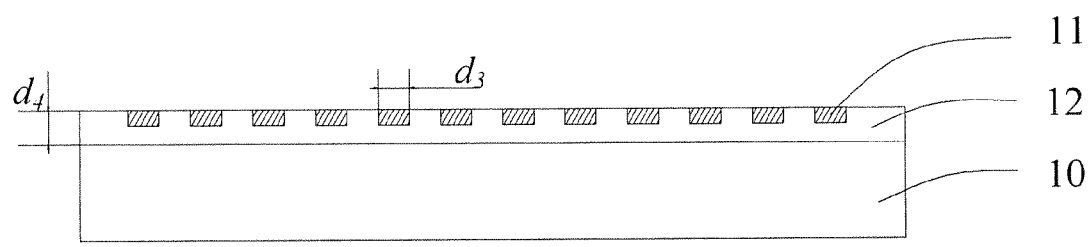
FIG. 6 is a schematic, cross-sectional view of the thickness of the transparent insulating layer equals to the width of the grooves of the present invention.

Referring to FIG. 6, in the illustrated embodiment, the thickness of the transparent insulating layer is defined as $d_4$, the width of the grooves is defined as $d_3$, which follows 0.5≤$d_4/d_3$≤1.5. When the transparent insulating layer 12 is coated on the surface of the transparent insulating substrate 10, and the transparent insulating layer 12 defines a plurality of grooves, due to the depth of the grooves being greater than or equals to the width of the grooves, the insulating lay 12 is prevented from being perforated to expose the transparent insulating substrate 10 in imprinting the grooves. When the ratio between the thickness $d_4$ of the transparent insulating layer 12 and the width $d_3$ of the grooves follows $0.5 \leq d_4/d_3 \leq 1.5$, the insulating layer 12 can have a satisfactory thickness, as well as be economic in material consuming. The smaller the value of the $d_4/d3$ is, the better the light transmission is; on the other hand, it is conducive to reduce the total thickness of the conductive film because the thickness $d_4$ of the transparent insulating layer 12 is not too bigger. It is further conducive to reduce the thickness of the touch screen.

In this illustrated embodiment, the conductive film further includes a protective layer located on the side of the transparent insulating layer 12 defining the grooves, for improving the mechanical properties of the transparent insulating layer 12 and protecting the transparent insulating layer 12 from being scratched. The protective layer is made of adhesives, such as gelatin, polymer and the like. The protective layer is attached to the side of the transparent insulating layer 12 defining the grooves, with a thickness thereof smaller than 0.2 μm, for preventing the transparent insulating layer 12 being scratched and improving the mechanical properties of the transparent insulating layer 12.

In one embodiment, the conductive film further includes a conductive polymer layer or a conductive particle layer, the conductive polymer layer or the conductive particles has low conductivity, high resistance, and good transparency. The conductivity is $1.0 \times 10^7$ Ω/sq or more. The high resistance transparent conductive layer is formed on the conductive film adjacent to the transparent insulating layer 12, to eliminate the deviation of the square resistance.

Figure 7:
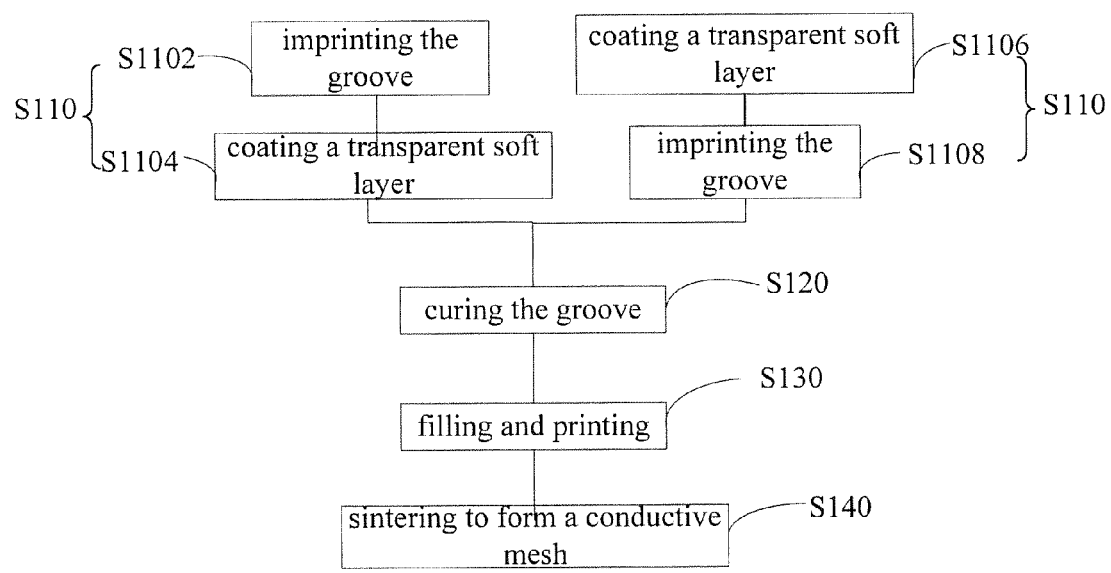
FIG. 7 is a flowchart of a method of preparing the conductive film of the present invention.

Referring to FIG. 7, a preparing method of a conductive film includes the following steps: Step S110: a surface of the transparent insulating substrate 10 or a transparent insulating layer 12 is imprinted to form mesh-like grooves by a mold. The transparent insulating substrate 10 and the transparent insulating layer 12 adjoin. The distance between the lines formed on the mold follows the formula 100 μm$\leq d_1 <$600 μm; Step S120: the grooves are cured; Step S130: blade coating, i.e, the grooves are filled with metal slurry with blade coating; Step S140: the filled metal slurry is sintered to form a conductive mesh with the square resistance of 0.1 Ω/sq$\leq$R$<$200 Ω/sq and the metal content of 0.7 g/m$^2$ to 0.8 g/m$^2$, thus the conductive film is formed. It is easy to operate and high efficiency to define mesh-like grooves in the transparent insulating substrate 10 by imprinting with a prepared mold, and then cure the grooves to form the grooves having high strength and fixed shape. Since a distance between the lines on the mold follows formula 100 μm$\leq d_1 <$600 μm, the grooves with a distance of the lines following formula 100 μm$\leq d_1 <$600 μm is obtained by imprinting with the mold. The imprinted grooves are filled with metal slurry, and the metal slurry is scraped to be evenly filled into the grooves; the metal slurry is sintered to form conductive lines. The solvent is evaporated during the sintering. The square resistance of the formed conductive mesh 11 follows formula 0.1 Ω/sq$\leq$R$<$200 Ω/sq. The metal content is 0.7 g/m$^2$ to 1.8 g/m$^2$. The metal material may be any one selected from the group consisting of gold, silver, copper, aluminum, zinc, and gold silver or an alloy thereof, preferably silver, the metal slurry is silver slurry.

In one embodiment, the step S110 of imprinting with a mold includes the following steps: step S1102: the grooves are formed through imprinting. The transparent insulating substrate 10 is imprinted to define mesh-like grooves on a surface of the transparent insulating substrate; and Step S1104: the transparent insulating layer 12 is coated, a glue is coated in the grooves to form the transparent insulating layer 12; or step S1106: the transparent insulating layer 12 is coated, a glue is coated on the surface of transparent insulating substrate 10 to form the transparent insulating layer 12; and step S1108: the grooves are formed through imprinting. The transparent insulating layer 12 is imprinted to define mesh-like grooves on a surface of the transparent insulating layer 12. The transparent insulating layer 12 is transparent, which does not impact the light transmission of the conductive film, and is self-adhesive thereby being capable of being bonded to the transparent insulating substrate 10 without other adhesive. Thus, the preparing process and composition of the conductive file are simplified. Coating glue in the grooves defined in the transparent insulating substrate 10 to form the transparent insulating layer 12, can bring effect of reducing total thicknesses of the transparent insulating substrate 10 and the transparent insulating layer 12, and material saving. The transparent insulating substrate 10 is coated with the transparent insulating layer 12 with certain thickness, and then the mesh-like grooves are defined in the transparent insulating layer 12 through imprinting with mold. Since the transparent insulating layer 12 is easy to shape, imprinting with mold is simple, fast way, and with economic way to shape the transparent insulating layer 12. Grooves with high strength are obtained after curing the grooves. Filling the silver-slurry in the grooves is not to deteriorate the light transmission of the conductive film.

In one embodiment, the distance $d_1$ between the lines of the conductive mesh 11 decided by imprinting with a mold follows formula 100 μm$\leq d_1 <$600 μm. The square resistance of the conductive mesh 11 formed through blade coating the metal slurry follows formula 0.1 Ω/sq$\leq$R$<$200 Ω/sq. The metal content of the conductive mesh is 0.7 g/m$^2$ to 1.8 g/m$^2$.

The distance $d_1$ between the lines of the mesh of the mold follows formula 100 μm$\leq d_1 <$600 μm, i.e. the grooves can be formed on the surface of the conductive mesh 11, the metal slurry is filled in the grooves and sintered to form the corresponding distance of the lines of the mesh, the width $d_2$ of the opaque line of the mesh is reduced by reducing the width $d_2$ of the line of the mesh, the light transmission of the conductive film is improved; and since the conductive mesh 11 is more intensive, the text and images displayed on touch screen are much clearer, the visibility is good.

The metal slurry is preferably silver slurry. The solvent is evaporated during the sintering, the silver is sintered to form conductive line of the mesh. The metal content of the conductive mesh 11 is 0.7 g/m$^2$ to 1.8 g/m$^2$, the surface square resistance of the conductive mesh is reduced, and material saving.

The metal content of the conductive mesh 11 is reduced by reducing the width $d_2$ of the line of the mesh, the square resistance of the conductive mesh follows formula 0.1 Ω/sq$\leq$R$<$200 Ω/sq. The square resistance of the conductive film has an impact to the conductivity, the conductivity of the conductive film can be improved by reducing the square resistance, the smaller the square resistance is, the better the conductivity is, the faster the transmission speed of the signal is; the square resistance of the conductive film is reduced till 0.1 Ω/sq$\leq$R$<$200 Ω/sq, which improves the conductivity of the conductive film, and the transmission speed of the signal is fast.

Of course, when the distance $d_1$ between the conductive mesh 11 is 100 μm$\leq d_1 <$600 μm; the square resistance is 0.1 Ω/sq$\leq$R$<$200 Ω/sq, the metal content is 0.7 g/m$^2$ to 1.8 g/m$^2$, the different values of those parameters can result in different conductivity and light transmission, there are subtle differences in the specific, according to the requirements to choose the corresponding values in the range, different conductive film can be obtained.

It should be understood that the descriptions of the examples are specific and detailed, but those descriptions can't be used to limit the present disclosure. Therefore, the scope of protective of the invention patent should be subject to the appended claims.

What is claimed is:

1. A conductive film, comprising:
a transparent insulating substrate and a conductive mesh formed on the transparent insulating substrate;
wherein a distance between the lines of the conductive mesh is defined as $d_1$, and follows formula 100 µm≤$d_1$<600 µm, and wherein the lines of the conductive mesh are uniformly arranged so that distance $d_1$ is an equal distance between neighboring lines of the conductive mesh; a square resistance of the conductive mesh is defined as R, and follows formula 0.1 Ω/sq≤R<200 Ω/sq.

2. The conductive film according to claim 1, further comprising a transparent insulating layer formed on a surface of the transparent insulating substrate, wherein the conductive mesh is embedded or buried in the transparent insulating layer.

3. The conductive film according to claim 1, further comprising a transparent insulating layer laid on a surface of the transparent insulating substrate, wherein the transparent insulating layer forms a plurality of intercrossing grooves, the conductive mesh is received in the grooves.

4. The conductive film according to claim 3, wherein the transparent insulating layer is made of one material selected from the group consisting of light curing adhesive, thermosetting adhesive, and self-curing adhesive.

5. The conductive film according to claim 4, wherein the transparent insulating layer is made of one material selected from the group consisting of shadowless adhesive, optical clear adhesive and liquid optical clear adhesive.

6. The conductive film according to claim 3, wherein a thickness of the transparent insulating layer is defined as $d_4$, and a width of the grooves is defined as $d_3$, and follows formula 0.5≤$d_4/d_3$≤1.5.

7. The conductive film according to claim 3, wherein the transparent insulating layer is provided with a protective layer on the side thereof defining the grooves for improving the effect of mechanical properties of the transparent insulating layer and preventing the transparent insulating layer from being scratched.

8. The conductive film according to claim 1, wherein the conductive mesh is made of one material selected from the group consisting of gold, silver, copper, aluminum, zinc, and gold silver or an alloy composed of at least two thereof.

9. The conductive film according to claim 8, wherein the conductive mesh is made of silver, and a silver content is 0.7 g/m2 to 1.8 g/m2.

10. The conductive film according to claim 1, wherein the distance between the lines of the conductive mesh is defined as $d_1$, and follows formula 200 µm≤$d_1$<500 µm.

11. The conductive film according to claim 1, wherein the distance defined as $d_1$ follows formula 200 µm≤$d_1$<350 µm.

12. The conductive film according to claim 1, wherein the distance defined as $d_1$ follows formula 350 µm≤$d_1$<500 µm.

13. The conductive film according to claim 1, wherein the square resistance of the conductive mesh is defined as R, and follows formula 0.1 Ω/sq≤R<60 Ω/sq.

14. The conductive film according to claim 1, wherein a width of the line of the mesh of the conductive mesh is defined as $d_2$, and follows formula 1 µm≤$d_2$≤10 µm.

15. The conductive film according to claim 14, wherein the width of the line of the mesh of the conductive mesh is defined as $d_2$, and follows formula 2 µm≤$d_2$≤5 µm.

16. The conductive film according to claim 1, wherein the conductive mesh consists of regular graphics in uniform arrangement.

17. The conductive film according to claim 1, wherein the transparent insulating substrate is made of material selected from the group consisting of polyethylene terephthalate plastic, transparent plastic material, polycarbonate, and glass.

* * * * *